(12) United States Patent
Maida

(10) Patent No.: US 6,384,687 B1
(45) Date of Patent: May 7, 2002

(54) SATURATION LIMIT CIRCUIT FOR JUNCTION ISOLATED PNP TRANSISTOR AND METHOD

(75) Inventor: Michael Maida, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/546,744

(22) Filed: Apr. 11, 2000

Related U.S. Application Data

(63) Continuation-in-part of application No. 09/544,009, filed on Apr. 6, 2000.

(51) Int. Cl.[7] ................................................. H03F 3/04
(52) U.S. Cl. ....................................... 330/296; 330/267
(58) Field of Search ................................. 330/267, 296, 330/292, 307

(56) References Cited

U.S. PATENT DOCUMENTS

| | | | | |
|---|---|---|---|---|
| 5,515,007 A | * | 5/1996 | Moraveji | 330/267 |
| 5,986,509 A | * | 11/1999 | Lohninger | 330/296 |
| 6,052,030 A | * | 4/2000 | Garner et al. | 330/282 |
| 6,064,268 A | * | 5/2000 | Felps | 330/296 |

* cited by examiner

Primary Examiner—Robert Pascal
Assistant Examiner—Khanh Van Nguyen
(74) Attorney, Agent, or Firm—Girard & Equitz LLP

(57) ABSTRACT

A transistor saturation control circuit for controlling saturation of a PNP transistor. The control circuit includes current sense circuitry which produces a control output in response to a change in current of an N well associated with the PNP transistor. Base drive control circuitry operates to limit base drive to the PNP transistor in response to the control output.

22 Claims, 5 Drawing Sheets

SATURATION LIMIT CIRCUIT FOR JUNCTION ISOLATED PNP TRANSISTOR AND METHOD

CROSS REFERENCE TO RELATED APPLICATIONS

The present application is a continuation-in-part of U.S. patent application Ser. No. 09/544,009 entitled "PNP HIGH-CURRENT, HIGH-SWING OUTPUT STAGE AND METHOD" filed on Apr. 6, 2000, now U.S. Pat. No. 6,366,170.

U.S. BACKGROUND OF THE INVENTION

1. Field of the Invention

The present invention relates generally to transistor control circuit and, in particular, to circuits for limiting saturation of transistors.

2. Description of Related Art

Almost all bipolar feedback amplifiers having an output which must swing close to one or both power supply rails requires the output transistors to operate in the saturation region. When the feedback circuit attempts to require the output to exactly equal the supply voltage, the transistor base drive will be made very large since the output will never reach the supply voltage due to the finite but low saturation voltage of the output transistor. As will be explained, driving certain types of transistors, such as junction isolated PNP transistors, deeply into saturation will cause parasitic current to be generated thereby resulting in, among other things, potential circuit latch-up.

FIG. 1A depicts one prior art approach to controlling the saturation level of a transistor. PNP transistor QA is shown with an emitter coupled to a positive supply VCC and a collector coupled to an output. The base is connected to receive an input Vin, typically provided by a preceding drive stage. A Schottky diode DS is connected between the base and collector of QA, with the diode anode connected to the collector.

The forward biased junction voltage of a Schottky diode is less than that of a comparable PN junction diode. Thus, as PNP transistor QA approaches saturation, diode DS will become forward bias before the collector-base junction of QA becomes forward. The diode will operate to essentially clamp the collector-base voltage at a voltage sufficiently small to prevent QA from becoming saturated.

One drawback to the use of Schottky diodes as a clamp is that QA is typically not permitted to enter saturation so that the minimum collector-emitter voltage will be much larger that the collector-emitter saturation voltage. Thus, Vout will not be able to swing up as close to VCC as desired. Further, many integrated circuit fabrication processes do not produce Schottky diodes.

Another prior art approach for saturation control is shown in FIG. 1B. Again, a PNP output transistor QA is used. Another PNP transistor QB is includes with a base connected to the base of QA and an emitter connected to the collector of QB. Typically, transistors QA and QB are lateral PNP transistors having a high collector/base breakdown voltage. A buffer circuit A has an input connected to the collector of QB and an output connected to an inverting input of a summing circuit. The non-inverting input to the summing circuit S receives the input Vin.

When transistor QA starts to saturation, transistor QB acts as a saturation detector and proceeds to conduct current. Buffer A act as a current comparator circuit, with current source IS producing the threshold current. Once transistor QB begins to conduct the threshold current, the magnitude of the input Vin is reduced, thereby preventing QA from becoming more deeply saturated. The degree of saturation of transistor QA can be controlled by setting IS to a particular level and by controlling the relative emitter areas of QA and QB.

For large output voltage swings where Vout moves away from supply VCC, the base-emitter voltage of QB will have a large reverse bias. Since the base-emitter breakdown voltage of QB is relatively small, on the order of 5–7 volts, the FIG. 1B circuit is limited to those application where the output swing is small.

FIG. 1C shows a still further prior art saturation control circuit. Transistor QC acts as a saturation detector and is connected to operate in the inverted mode. The base-collector junction of QC, with acts a the base-emitter junction, becomes forward biased when QA starts to saturate thereby causing current to flow out of the emitter of QC. Output transistor QA is typically driven by a transistor QD connected as an emitter follower. Current flow out of transistor QC steals current drive from QD thereby preventing QA from becoming more saturated. The breakdown voltage of the collector-base junction of inverted mode transistor QC is larger than the breakdown voltage of base-emitter junction of transistor QB of FIG. 1B so that the output voltage swing of the FIG. 1C circuit is not limited as it is in the FIG. 1B circuit.

The FIG. 1C circuit has several limitations. First, the excess base drive of QA is a function of the reverse-active common-collector current gain and collector resistance of transistor QC. These parameters are difficult to model in a junction-isolated bipolar process, which make the behavior of the FIG. 1C circuit difficult to predict in those applications.

Further, the amount of excess base drive of QA is directly proportional to the area ratio of QA to AC and inversely proportional to the PNP reverse common-collector current gain. The current gain is usually much less than unity so that circuit must be design for a low excess base drive and N well current of QA and QB. Thus, it is possible that QC may even have to be bigger than output transistor QA, something undesirable both in terms of die size and capacitance.

Finally, the emitter-base breakdown voltage of sense transistor QC limits the FIG. 1C circuit to those where QA is either driven by an emitter follower as shown or a similar non-inverting current amplifier with a DC input very close to VCC. If output transistor QA is driven by a common emitter configured transistor, it is very difficult to use the FIG. 1C saturation control approach.

There is a need for a saturation control circuit which addresses all, or most of, the above-noted shortcomings of the prior art. As will become apparent to those skilled in the art upon a reading of the following Detailed Description of the Invention together with the drawing, saturation control circuits in accordance with the present invention meets these and other needs.

SUMMARY OF THE INVENTION

A transistor saturation control circuit for controlling a saturation of a main PNP transistor. In one embodiment, the main PNP transistor is a vertical junction isolated transistor having an associated parasitic NPN transistor with the base of the main PNP transistor forming the emitter of the parasitic transistor and the emitter of the main transistor forming the base of the parasitic transistor, with an N well associated with the main transistor forming a collector of the parasitic transistor.

The control circuit includes current sense circuitry the provides a control output in response to a change in current of the N well. This change in current indicates the saturation level of the main PNP transistor. Base drive circuitry coupled to the base of the main PNP transistor is configured to limit base drive to the PNP transistor in response to the control output. The change in current in the N well indicates the saturation level of the main PNP transistor. As the saturation level is approached or increased, the base drive to the main PNP is reduced thereby preventing the PNP transistor from becoming saturated or more saturated.

DETAILED DESCRIPTION OF THE INVENTION

Figure 2:
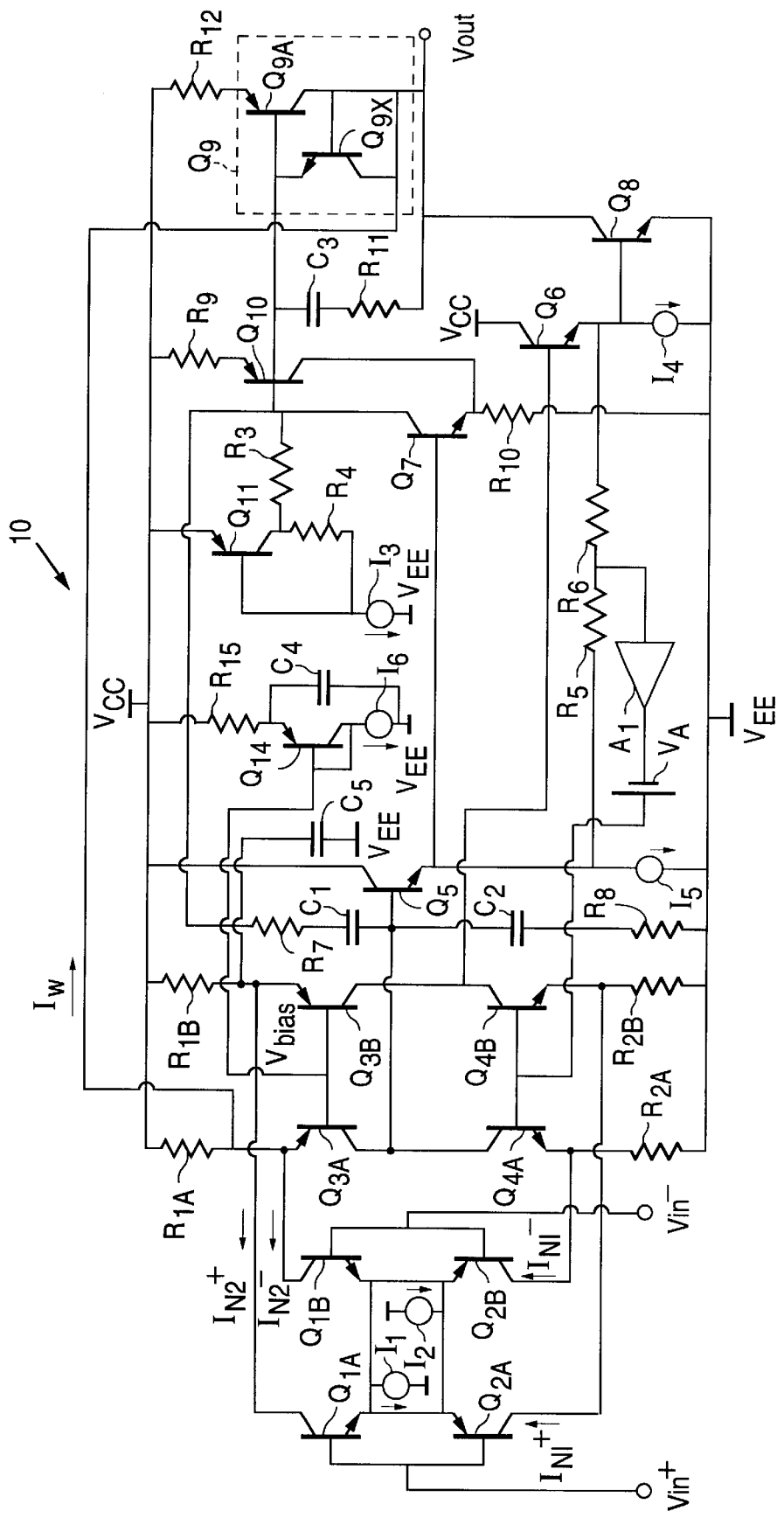
FIG. 2 is a schematic diagram of a amplifier circuit having an output circuit utilizing saturation control circuitry in accordance with one embodiment of the present invention.

Referring again to the drawings, FIG. 2 is a schematic diagram of an amplifier circuit 10 which incorporates one embodiment of the subject saturation control circuit. It will be appreciated that saturation control circuit can be used in a wide variety of other applications.

Amplifier circuit 10 includes an input stage capable of operating with differential input Vin+ and Vin− operating close to the power supply rails VCC and VEE. The input stage includes NPN transistors Q1A and Q1B connected as a differential pair together with a tail current source I1. PNP transistors Q2A and Q2B form a second differential pair connected to a tail current source I2. The common bases of transistors Q1A and Q2A are connected to receive input Vin+, with the common based of transistors Q2A and Q2B being connected to received input Vin−.

Although not depicted, tail current steering circuitry operates to sense the common mode input voltage, (Vin++Vin−)/2, and turn off source I2 when the common mode input voltage is in the upper region of the voltage range defined by VCC and VEE and to turn off source I1 when the common mode voltage is in the lower region of the range. Thus, current outputs IN1+ and IN1− of differential pair Q2A and Q2B drop to zero when the common mode input voltage is in the upper range so that differential pair Q2A and Q2B are inactive. Similarly, current outputs IN2+ and IN2− of differential pair Q1A and Q1B drop to zero when the common mode input voltage is in the lower half of the voltage range thereby rendering differential pair Q1A and Q1B inactive.

The intermediate stage following the input stage is sometimes referred to as a cascode dual input turnaround stage. As will be explained, the output stage following the intermediate stage includes an output transistor incorporating saturation control circuitry in accordance with the present invention.

The intermediate stage includes a pair of PNP transistors Q3A and Q3B connected in a common base configuration for level shifting currents IN2+ and IN2−. Transistors Q3A and Q3B are connected in series with resistors R1A and R1B, respectively, and are biased by voltage Vbias for operation close to upper supply voltage VCC. Voltage Vbias is produced by a PNP transistor Q14 which is connected as a diode. A resistor R15 is connected intermediate the emitter of Q14 and positive supply VCC. A current source I6 biases transistor Q14.

The intermediate stage further includes a pair of NPN transistors Q4A and Q4B connected in a common base configuration for level shifting currents IN1+ and IN1−. Resistors R2A and R2B are connected in series with transistors Q4A and Q4B, respectively, with the transistors being biased by the output of a common mode feedback circuit to be described.

One-half of the differential output of the turn around stage is connected to the base of emitter-follower configured NPN transistor Q5. The other half of the differential output is connected to the base of emitter-follower configured transistor Q6. A pair of equal value resistors R5 and R6 are connected in series between the emitters of transistors Q5 and Q6 so that the voltage intermediate the resistors is indicative of the common mode voltage of the intermediate stage. The intermediate voltage is connected to the input of a buffer circuit A1, the output of which is connected to a level shifting element VA. The output of element VA is connected to the common bases of transistors Q4A and Q4B so as to provide a common mode feedback path. The feedback maintains transistors Q4A and Q4B in the active region and ensures that Q3A and Q4A have equal collector currents and that Q3B and Q4B have equal collector currents. Further details of the construction of buffer A1 and level shifter VA will be provided later.

The output of emitter-follower configured transistor Q6 is connected to the base of output NPN transistor Q8. The collector of output transistor Q8 is connected to the output of the amplifier circuit 10 where Vout is produced. Transistors Q6 and Q7 provide current gain for the negative swing of Vout. Transistors Q5 and Q7 drive output PNP transistor Q9 and provide current gain for the positive swing of Vout. Output transistor Q9 is shown in FIG. 2 with the primary PNP transistor Q9A and an associated parasitic transistor Q9X. As will be explained in greater detail, current flow associated with parasitic transistor Q9X is used to prevent transistor Q9 from becoming deeply saturated.

It is desirable that the output stage have the same current gain when sourcing and sinking current. A significant difference in gain can render the amplifier using the output stage difficult to stabilize. Transistors Q6 and Q8 determine the current gain when sinking current, with the gain being approximately equal to the product of the gain of each transistor. The transistors that would normally determine the current gain when sourcing current include Q5, Q7 and Q9. PNP transistor Q10 is provided for limiting the current gain of Q9 so that the sinking current gain is closer to the sourcing current gain. A resistor R9 is connected between the emitter of Q10 and supply VCC, with the collector of Q10 being connected between the emitter of Q7 and a resistor R10. Increased current flow through Q7 tends to turn on transistor Q10 harder thereby increasing the voltage drop across resistor R10. Once the increase in voltage at the emitter of Q7 becomes large with respect to the value of kT/q, transistor Q7 will tend to turn off thereby decreasing base drive to output transistor Q9. This local feedback thus limits the current gain at high output sourcing currents and has no effect at lower currents. Resistor R12 connected between the emitter of Q9 and power supply VCC represents the various ballast resistors associated With the individual transistors which make up large transistor Q9. As is well known, these individual ballast resistors ensure that current flow is evenly distributed among the individual transistors. Resistor R9 connected between the emitter of transistor Q10 and VCC operates to compensate for the voltage drop across resistor R12. In order to reduce power consumption, transistor Q10 has an emitter area which is typically 1/10 that of transistor Q9.

The quiescent current through output transistors Q8 and Q9 is well controlled since the base-emitter voltages of the two transistors are both defined. In the present case, the amplifier operates as a Class AB output, with there being a quiescent current typically of 250 µA and a peak output current of typically 100 mA.

Note that when the tail current switching circuitry (not depicted) operates to switch between differential pair Q1A/Q1B and Q2A/Q2B, the resultant change in currents IN2+ and IN2− will result in an undesirable change in current flow through transistors Q3A and Q3B. This will result in a change in the output quiescent current. In order to maintain a constant current in Q3A and Q3B, voltage Vbias is caused to decrease relative to VEE when pair Q1A/Q1B are made active to compensate for currents IN2+ and IN2−, the presence of which tend to cause the emitter voltages of Q3A and Q3B to drop. The change in Vbias can be accomplished by increasing the value of I6. Assuming that R1A, R1B and R15 are the same value and assuming that transistors Q3A, Q3JB and Q14 are the same size, this can be accomplished by increasing I6 by an amount equal to I1/2.

The FIG. 2 output stage provides current limiting with no loss in voltage swing of Vout. When the output stage is sinking a large amount of current from a load through transistor Q8, transistor Q6 is driven on as much as possible, with transistor Q5 being shut off. The common mode feedback provided by buffer A1 and related circuitry operates to maintain the buffer input at the node intermediate resistors R5 and R6 at a constant voltage in order to ensure that transistors Q4A and Q4B are biased correctly. Since transistor Q5 is off, all of the current drawn by current source I5 is drawn through resistors R5 and R6. Transistor Q6 is the source of the current flow through R5 and R6. Under quiescent conditions, there is negligible current flow through resistors R5 and R6. Given that the voltage at the node between resistors R5 and R6 remains constant, the base-emitter voltage of transistor Q8 will increase by the increase in voltage drop across R6 (I5×R6) from quiescent operation to current limit. Since the maximum base-emitter voltage of transistor Q8 is thus defined, the current limit point of Q8 is also defined.

When the output stage is sourcing the maximum amount of current to a load by way of transistor Q9, transistor Q6 is off and transistor Q5 is driven on as much as possible. Thus, resistors R5 and R6 conduct all of the current drawn by current source I4. The emitter voltage of transistor Q5 will increase by a voltage equal to the increase in voltage across resistor R5 (I4×R5). Again, since the maximum base-emitter voltage of Q5 is set, the maximum current through the transistor is set. Note that the change emitter voltage of transistor Q7 when transistor Q10 begins conducting so as to reduce the current gain has only a negligible effect on the operation of the current limit function provided by resistor R5 and current source I4.

Figure 3:
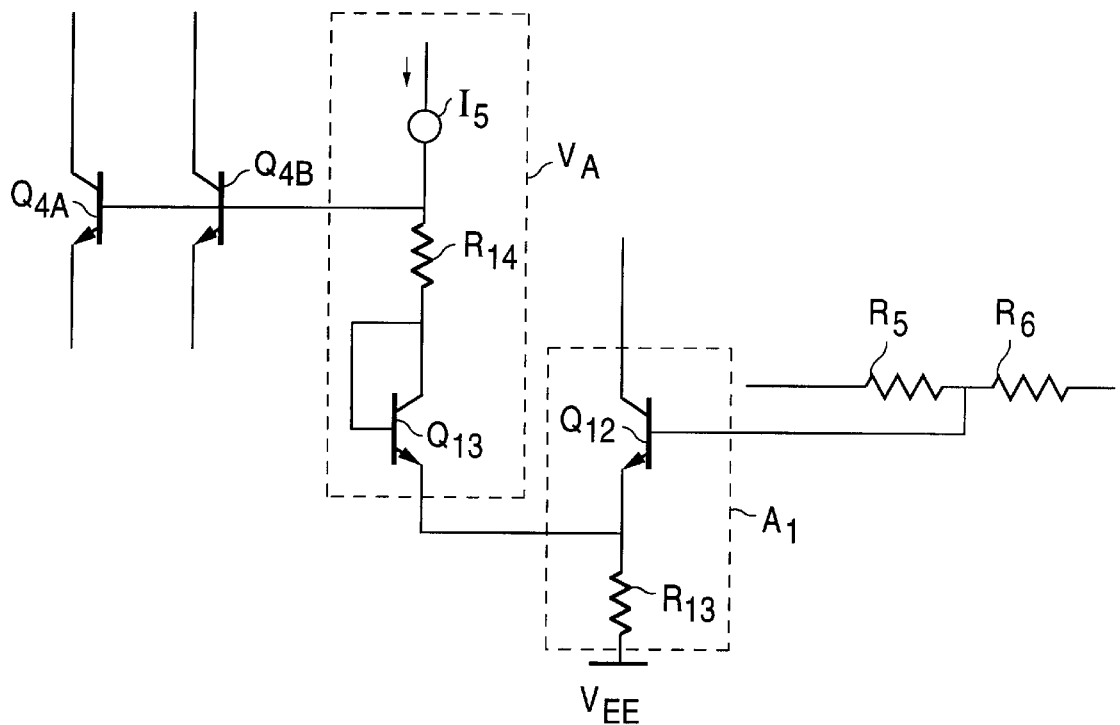
FIG. 3 is a schematic diagram of a detailed implementation of the common mode feedback circuit used in the FIG. 2 amplifier output stage.

FIG. 3 is a schematic diagram showing one implementation of the buffer A1 and the level shifting circuit VA. The buffer circuit includes an emitter-follower configured NPN transistor Q12 having a base connected to the node intermediate resistors R5 and R6 and an emitter connected to supply VEE by way of resistor R13. The output of the buffer A1 is the connected to the emitter of a diode-connected transistor Q13. A constant current source I5 provides a constant current that flows through a resistor R14 and transistor Q13 so the base-emitter voltage of Q12 is canceled by the base-emitter voltage of transistor Q13. Thus, the voltage applied to the common bases of transistors Q4A and Q4B is equal to the voltage at the node intermediate resistors R5 and R6 plus the voltage drop across R14 (I5×R14).

The base transistor Q9 is biased by a bias circuit which provided an optimum base-emitter voltage and optimum impedance. PNP transistor Q11 has an emitter connected to the supply VCC and a collector connected to a current source by way of a resistor R4. Since the base current of Q11 is relatively small, most of the current into current source I3 is by way of resistor R4. Inspection of the circuit shows that the voltage at the collector of Q11, the thevenin equivalent output voltage of the bias circuit, is the base-emitter voltage of Q11 less the voltage drop across R4 produced by current I3. The output impedance of the bias circuit is approximately equal to the resistance of R3 plus the output impedance of transistor Q11. Output transistor Q9 is much larger, typically a few hundred times larger, the Q11. Thus, in order to bias Q9 with a base-emitter voltage so that Q9 conducts a desired quiescent current, typically on the order of 100 µA, it is necessary for the base-emitter voltage of Q11 to be reduced by some factor, typically by a 100 mV drop across resistor R4. The ouput impedance R of the bias circuit is selected such that the impedance in combination with Miller compensation capacitor C3 produce a pole at a frequency F=1/(2π R C3) as a frequency that is approximately 2 to 3 times the overall unity-gain frequency. The impedance is thus high enough so that the Miller compensation capacitor C3 can be effective. Further, the impedance is low enough such that settling time and slew performance are good.

One important aspect of the output stage of FIG. 2 is that there is only a single PNP transistor, Q9, in the forward signal path. Since PNP transistors usually have a lower $F_T$ (unity current gain-bandwidth product) and a lower β than an NPN transistor, performance is enhanced.

Figure 1A:
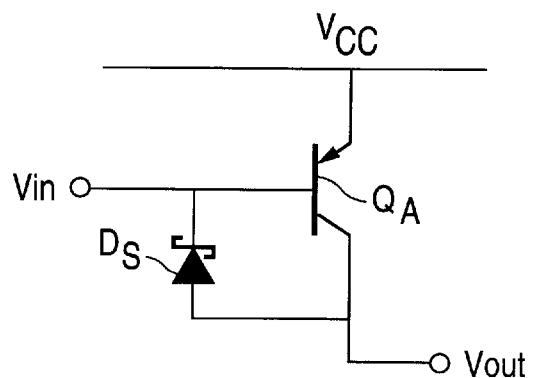
FIGS. 1A, 1B and 1C are simplified schematic diagrams of conventional transistor saturation control circuits.
Figure 1B:
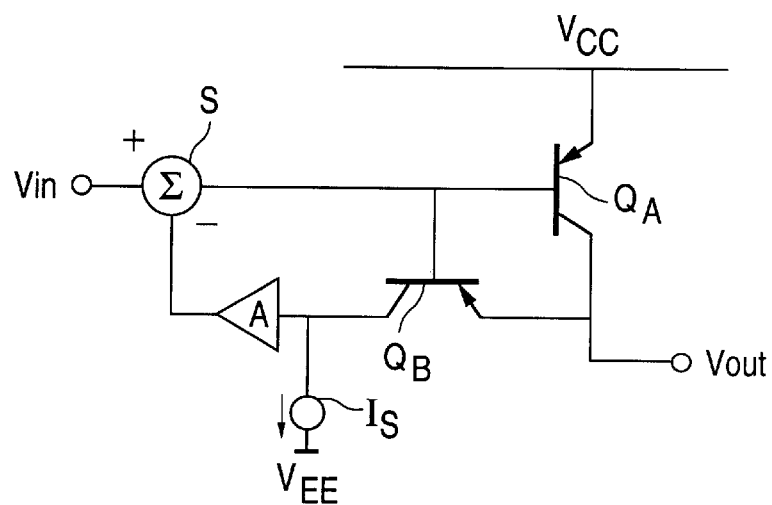
Figure 1C:
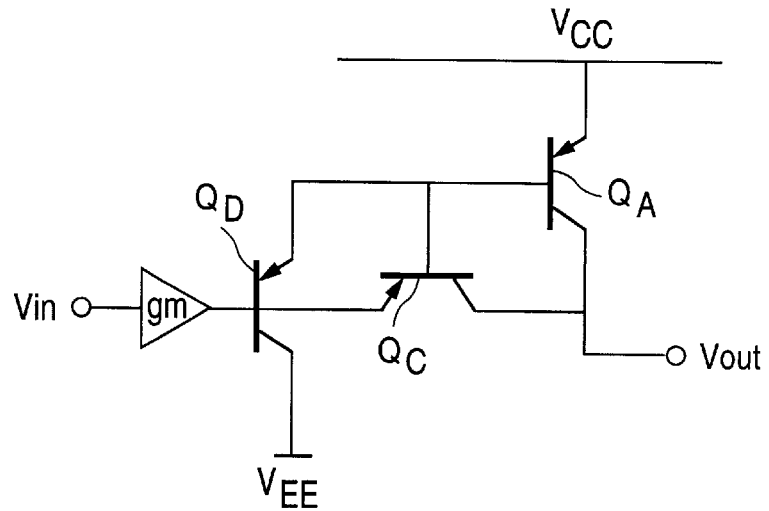
Figure 6:
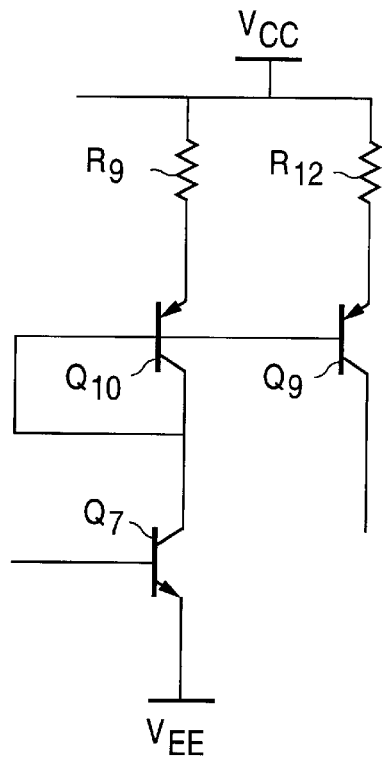
FIG. 6 is an alternative circuit arrangement for current gain limiting of the FIG. 2 amplifier output stage.

The FIG. 2 circuit is compensated by the Miller capacitor C3 and resistor R11 and by capacitor C2 and resistor R7. Unlike the prior art circuit of FIG. 1C, the impedance presented by resistor R3 and associated circuitry is large enough to make the Miller compensation capacitor C3 effective. Compensation capacitor C3 and R8 are optional. FIG. 6 shows an alternative connection for transistors Q7, Q9 and Q10 for limiting the current gain of the output stage when sourcing current. Rather than having the collector of Q10 connected to the emitter of transistor Q7 as shown in FIG. 2, transistor Q10 is diode-connected, with the collector/base of Q10 being connected to the collector of Q7. Transistors Q10 and Q9 operate together to form a current mirror, with the ratio of current between Q9 and Q10 effectively controlling the current gain of Q9. The current ratio of the two transistors is inversely related to the ratio of the emitter areas of Q9 and Q10, with Q9 typically being ten times larger than Q10. Thus, the effective current gain remains fixed at ten, a gain much lower than the typical current gain β of Q9 alone. Accordingly, the current gains for sourcing and sinking current are more closely matched thereby causing the circuit operation to be more stable. Note that resistor R9 in the FIG. 6 embodiment performs a function in addition to compensating for the presence of transistor Q9 ballast resistors R12. Resistor R9 increases the impedances the base of transistor Q9 thereby rendering the Miller compensation capacitor C3 (FIG. 2) effective.

Referring again to the FIG. 2 circuit, during normal operation, output voltage Vout is driven towards supply vcc so that transistor Q9 will be driven into saturation. Typically, the amplifier feedback action will attempt to force Vout to be equal to VCC, but no matter how much the base drive is increased, the saturation voltage will always be greater than zero. Further, the current gain or β of Q9 will decrease substantially as a result so that a large base drive current for Q9 will be required to support a given output current. Further, many types of transistor structures made using junction-isolated processes have parasitic transistors which can turn on during saturation. These parasitic transistors may cause latchup and unpredictable IC behavior as a result. In order to reduce the magnitude of the base drive current and to conserve power, and in order to prevent possible latchup with respect to transistor Q9, saturation control circuitry is provided for output transistors Q8 and Q9. Transistor Q9 utilizes saturation control circuitry in accordance with the present invention.

Although not depicted, a conventional inverted mode transistor is connected across the base-collector junction of transistor Q8 which prevents the base-collector junction from being forward biased thereby keeping the transistor out of saturation. This approach was previously described in connection with the prior art circuit of FIG. 1C. The base and collector of the inverted mode transistor are connected to the base and collector, respectively, of Q8, with the emitter of the inverted mode transistor being connected to the base of Q6.

Figure 4:
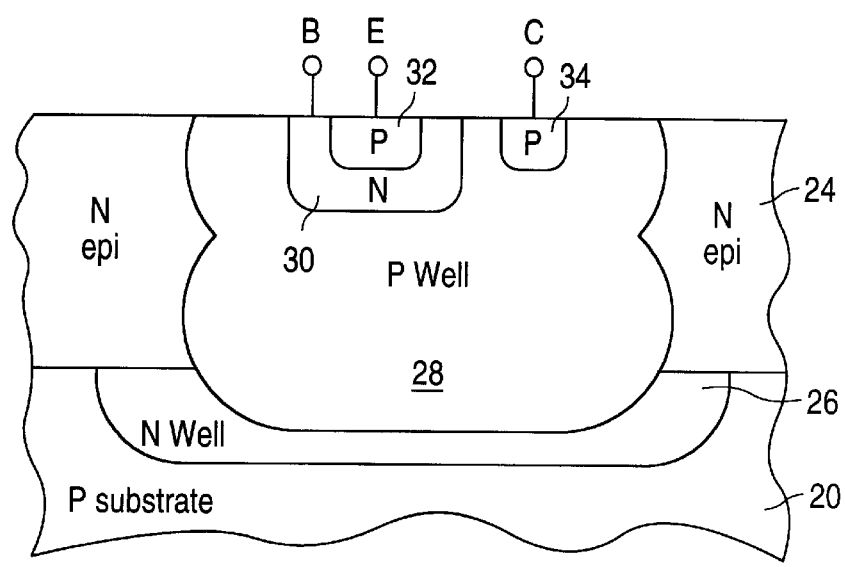
FIG. 4 is a cross-section of a conventional PNP transistor structure which is used as one of the output transistors of the FIG. 2 amplifier output stage and which is capable of incorporating the saturation control circuitry in accordance with one embodiment of the present invention.

The circuitry for limiting the saturation of transistor Q9, in accordance with the present invention, takes advantage of the junction-isolated vertical structure of the PNP transistor. FIG. 4 is a schematic illustration of a cross-section of in integrated circuit incorporating a PNP transistor such as Q9. The structure includes a P substrate 20 and an N type epitaxial layer 24. An N well 26 is formed in substrate followed by a P well 28 formed in the epitaxial layer 26 and substrate 20. A collector C contact for the PNP is formed in the P well 28 by way of P diffusion 34. An N region 30 is formed in the P well 28 to create the base B of the PNP, with the P region 32 formed in the N region 30 functioning as the emitter E of the transistor.

Figure 5:
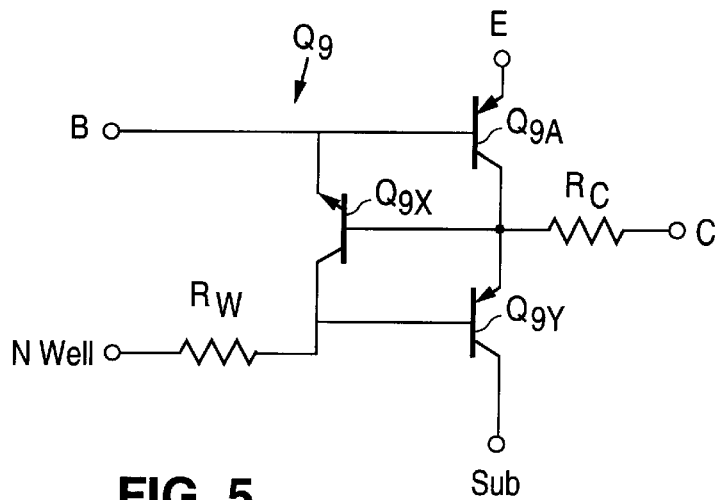
FIG. 5 is a schematic diagram of an equivalent circuit of the FIG. 4 transistor structure.

As previously noted, PNP transistor Q9 includes the desired transistor Q9A and a parasitic NPN transistor Q9X. The N type base region 30 forms the "emitter" of Q9X, the P well 28 forms the "base" and N well 26 forms the "collector". FIG. 5 is a schematic diagram showing the electrical relationship between desired transistor Q9A and the parasitic transistor Q9X. As can be seen from FIG. 5, there is also a parasitic PNP transistor Q9Y having an "emitter" formed by the P well 28, a "base" formed by the N well 26 and a "collector" formed by the substrate 20. When the desired PNP transistor Q9A is driven into saturation, the collector-base junction becomes forward biased. If the forward biasing voltage is large enough, the "base-emitter" junction of parasitic transistor Q9X becomes forward biased thereby tuning the normally-off parasitic transistor Q9X on. This causes some of the base drive current for Q9 to be diverted to the N well 26 in the form of well current $I_W$. This current will cause a voltage to be developed across the N well parasitic resistance $R_W$ having a polarity which will tend to forward bias parasitic transistor Q9Y. As desired transistor Q9A is driven deeper into saturation, current $I_W$ will increase until one base-emitter voltage is developed across parasitic resistance $R_W$ thereby turning on parasitic PNP transistor Q9Y. This causes current flow from the upper supply VCC connected to the emitter of Q9A to the lower supply VEE connected to substrate 20, a current which can greatly exceed the quiescent current of the output stage. Thus, it is important to control the saturation limit of transistor Q9 so that the transistor will be deep enough into saturation to permit Vout swing up close to upper supply VCC and not so deep as to turn on the parasitic PNP transistors.

Saturation of transistor Q9 is controlled by monitoring the N well current $I_W$ of the transistor, that is, the current flow into the collector of parasitic transistor Q9X. The magnitude of this current is a function of the degree of forward bias of the base-collector junction of parasitic transistor Q9Y which represents the degree to which the transistor Q9Y is saturated.

As can be seen in FIG. 2, the N well of output transistor Q9 is connected to the node intermediate resistor R1A and transistor Q3A. When transistor Q9 is driven hard so that Vout approaches supply VCC, the transistor begins to saturate. As a result, current $I_W$ will begin to increase thereby decreasing the emitter voltage of transistor Q3A. This will cause the transistors Q5 and Q7 to begin to turn off thereby limiting base drive to Q9. Well current $I_W$ will no longer increase thereby allowing Q9 to remain saturated, but not so deeply saturated that parasitic transistor Q9Y (FIG. 5) is turned on.

The collector-to-N well capacitance of output transistor Q9 can be relatively large. The saturation control connection from Q9 back to Q3A provides a positive AC feedback path which requires compensation. Capacitor C4 connected between the node intermediate the emitter of transistor Q14 and resistor R14 and the negative supply voltage VEE compensates for the parasitic capacitance of Q9. Capacitor C5 connected between the node intermediate Q3B and resistor R1B and negative supply VEE compensates for the effect of capacitor C4. Ideally, capacitor C4 is a junction capacitor made to track the parasitic capacitance of Q9.

Figure 7:
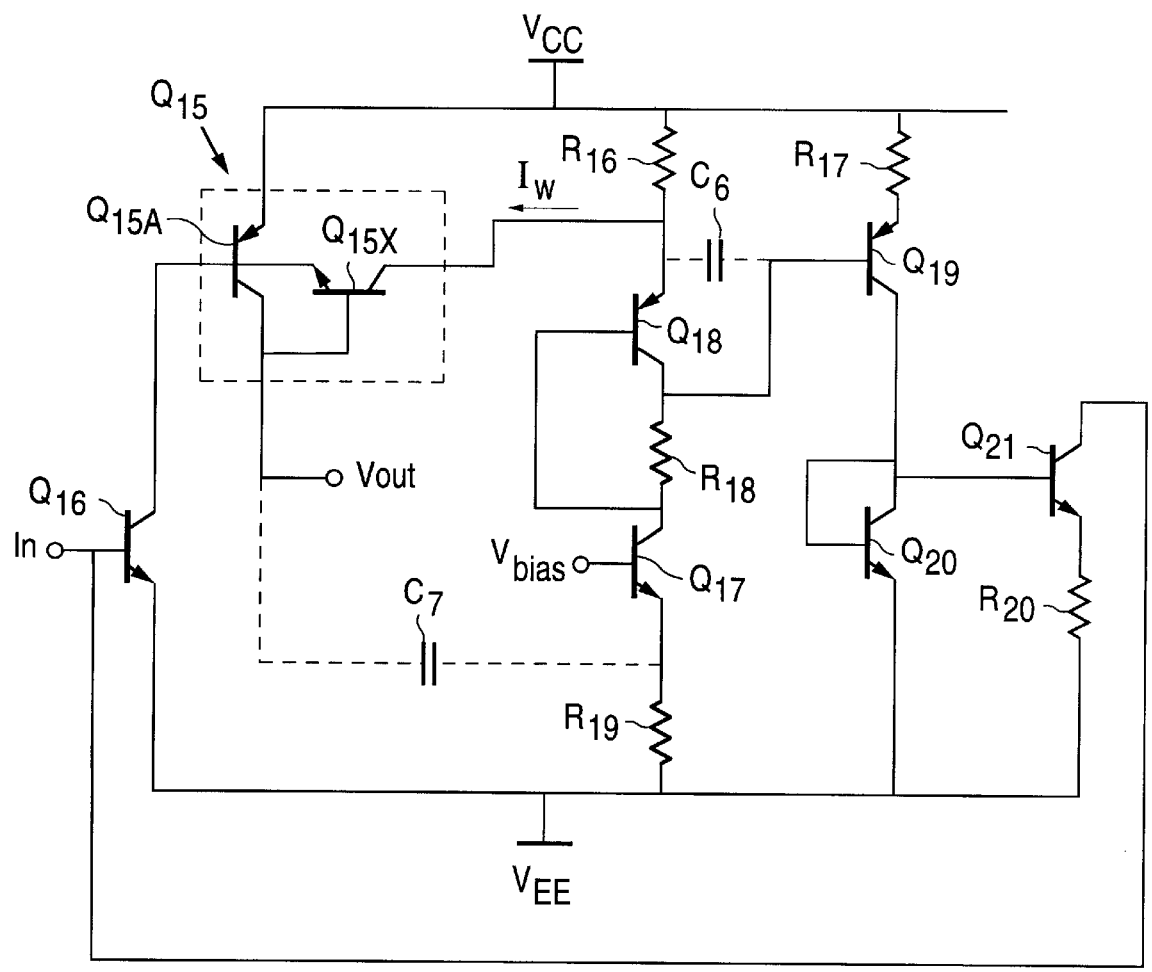
FIG. 7 is a schematic diagram of another embodiment of a saturation control circuit in accordance with the present invention.

FIG. 7 is a further embodiment of a saturation control circuit in accordance with the present invention. A junction isolated PNP transistor Q15 has a collector coupled to the amplifier output and an emitter coupled to the positive supply voltage VCC. As shown in FIG. 5, transistor Q15 includes the desired transistor and a parasitic NPN transistor Q15X. The parasitic PNP transistor is not shown.

A common emitter NPN transistor Q16 has a collector driving the base of Q16 and an base for receiving an input signal, with the input signal typically being produced by some intermediate stage of an amplifier circuit. The N well connection of output transistor Q15 is connected to a node intermediate a resistor R16 and a PNP transistor Q18. Thus, when transistor Q15 begins to saturate, N well current IW begins to flow out of resistor R16 thereby causing the voltage at the emitter of Q18 to drop.

Transistor Q18 and resistor R18 operate to level shift the voltage change at the emitter of Q18 to the base of another PNP transistor Q19. Transistor Q17 in combination with resistor R19 form a current source for biasing transistor Q18. At a certain level of well current IW, transistor Q19 begins to conduct thereby increasing the base-emitter voltage of Q21 so that Q21 also conducts.

The collector of Q21 is feed back to the base of input transistor Q16. Thus, as output transistor Q15 goes deeper into saturation, the collector of Q21 draws more current thereby pulling down the base voltage of Q16 so as to limit the base drive to the output transistor. This negative feedback operates to control the saturation level of output transistor Q15.

Since Q18 is biased by the transistor Q17 current source, it is possible to select the value of resistor R19 and the relative sizes of transistors Q18 and Q19, transistors Q19 and Q21 can be biased to have a very low quiescent currents This will minimize the positive feedback from the junction capacitance of transistor Q15 since the Gm of transistor Q19 will be very low. Resistor R17, transistor Q20 and resistor R20 act to reduce the overall loop gain when transistor Q15 saturates to improve stability. Capacitor C6 connected between the emitter and collector of Q18 acts as a feedforward to improve loop stability.

Capacitor C7 connected between the amplifier output and the node intermediate the emitter of transistor Q17 and resistor R19 operates to improve the large signal transient response or slew recovery of the amplifier. A negative-going output transition can couple the base of Q19 by way of capacitor C6 and the junction capacitance of Q18. This would cause transistors Q19 and Q21 to conduct. To a first order, this would constitute positive feedback thereby enhancing the slew rate. However, the terminal voltages of transistor Q18 tend to settle slowly at the desired low current, high impedance levels. By carefully choosing C7, the base of Q19 can be held relatively constant while the output slews negative, which in turn improves the amplifier transient response.

Figure 8:
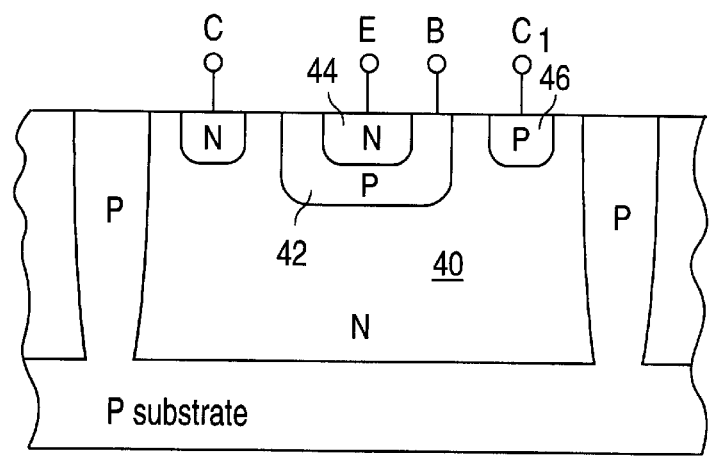
FIG. 8 is a diagram of an alternative transistor structure which permits saturation control of an NPN transistor.

FIG. 8 illustrates another embodiment of the present invention which permits the saturation level of an NPN transistor to be controlled. The structure includes all of the elements on a conventional junction isolated NPN lateral transistor, including an N region 40, P region 42 and N region 44. Regions 40, 42 and 44 form the collector, base and emitter of the NPN transistor, respectively. A special P region 46 is formed in the N region 40 to create what can be considered a parasitic PNP transistor. Regions 46, 40 and 42 form the collector, base and emitter of the PNP transistor.

The PNP collector C1 should be biased at a relatively low voltage to ensure that the PN junction associated with region 46 remain s reversed biased. When the NPN transistor becomes saturated, the base-emitter junction on the NPN begins to turn on so that current flows out of collector C1. This current, or change in current, can be sensed in a manner similar to that previously described in connection with the earlier embodiments and used to limit drive to the NPN transistor so as to carry out the saturation control function.

Thus, various embodiments of a novel saturation control circuit have been disclosed. Although these embodiments have been described in some detail, it is to be understood that certain changes can b e made by those skilled in the art without departing from the spirit and scope of the invention as defined by the appended claims.

What is claimed is:

1. A transistor circuit having saturation control circuitry, said circuit comprising:

a main PNP transistor;

current sense circuitry configured to provide a control output in response to a change in current of an N well associated with the main PNP transistor; and base drive circuitry coupled to a base of the main PNP transistor and configured to limit base drive to the main PNP transistor in response to the control output.

2. The transistor circuit of claim 1 wherein the main PNP transistor has an emitter coupled to a first power supply rail and wherein the current sense circuitry includes a first resistor having a first terminal coupled to the first power supply rail and a second terminal coupled to conduct the N well current.

3. The transistor circuit of claim 2 wherein the base drive circuitry includes a first NPN transistor having a collector coupled to the base of the main PNP transistor, with base drive to the first NPN being limited in response to an increase in voltage across the first resistor.

4. The transistor circuit of claim 3 wherein the base drive circuitry further includes a second PNP transistor having a an emitter coupled to the second terminal of the first resistor and a base coupled to a bias voltage generator.

5. The transistor circuit of claim 4 wherein the collector of the second PNP transistor is coupled to a base of the first NPN transistor.

6. The transistor circuit of claim 5 wherein the bias voltage generator includes a third PNP transistor having an emitter coupled to the first power supply rail by way of a second resistor and a base coupled to the base of the second PNP transistor.

7. The transistor circuit of claim 6 wherein the base drive circuitry further includes a first frequency compensation capacitor having a first terminal coupled to a node Intermediate the emitter of the third PNP transistor and the second resistor.

8. The transistor circuit of claim 3 wherein the base drive circuitry further includes a second PNP transistor having an emitter coupled to the second terminal of the first resistor, a second resistor having a first terminal coupled to a collector of the second PNP transistor and a third PNP transistor having a base coupled to the collector of the second PNP transistor.

9. The transistor circuit of claim 8 wherein the base drive circuitry further includes a second NPN transistor having a base coupled to a collector of the third PNP transistor and a collector coupled to a base of the first NPN transistor.

10. The transistor circuit of claim 9 wherein a first frequency compensation capacitor is coupled between the emitter of the second PNP transistor and the base of the third PNP transistor.

11. The transistor circuit of claim 10 a second frequency compensation capacitor is coupled between the collector of the main PNP transistor and a node intermediate the second resistor and a second power supply rail.

12. The transistor circuit of claim 11 wherein the base drive circuitry further includes a fourth NPN transistor having a collector coupled to a second terminal of the second resistor and an emitter coupled to the second power supply rail by way of a third resistor.

13. The transistor circuit of claim 12 wherein the node intermediate the second resistor a second power supply rail is the emitter of the fourth NPN transistor.

14. A transistor circuit with saturation control, said circuit comprising:

a desired bipolar transistor of a first conductivity type having an emitter region, a base region and a collector region;

a parasitic bipolar transistor of a second conductivity type, opposite the first conductivity type, said parasitic bipolar transistor having a base region, at least a part of which is formed in common with the collector region of the desired bipolar transistor, and an emitter region, at least part of which is formed in common with the base region of the desired bipolar transistor;

current sense circuitry configured to provide a control output in response to a change in collector current of the parasitic bipolar transistor; and drive circuitry for driving the desired bipolar transistor and configured to limit drive to the desired bipolar transistor in response to the control output.

15. The transistor circuit of claim 14 wherein the emitter of the desired bipolar transistor is coupled to a first power supply rail and wherein the current sense circuitry includes a first resistor having a first terminal coupled to the first power supply rail and a second terminal connected to the collector of the parasitic bipolar transistor.

16. The transistor circuit of claim 15 wherein the drive circuitry includes a third bipolar transistor of the second conductivity type having a collector coupled to the base region of the desired bipolar transistor.

17. The transistor control circuit of claim 16 wherein the first and second conductivity types are PNP and NPN types, respectively.

18. A method of controlling the saturation level of a first transistor of a first conductivity type having an associated second parasitic transistor of a second conductivity type, opposite the first conductivity type, wherein the first transistor has a base region which is formed at least partially in common with an emitter region of the second transistor and wherein the first transistor has a collector region which is formed at least partially in common with an base region of the second transistor, said method comprising:

sensing a change in collector current of the second transistor; and limiting drive to the first transistor in response to said sensing.

19. The method of claim 18 wherein the sensing includes conducting the collector current through a first resistor.

20. The method of claim 19 wherein the limiting includes level shifting a voltage change across the first resistor to produce a level shifted voltage change.

21. The method of claim 20 wherein the limiting includes reducing a base-emitter voltage of a third transistor of the second conductivity type.

22. The method of claim 21 wherein the first and second conductivity types are PNP and NPN conductivity types, respectively.

* * * * *